US010295393B2

(12) United States Patent
Eriksson

(10) Patent No.: US 10,295,393 B2
(45) Date of Patent: May 21, 2019

(54) GUIDED WAVE RADAR LEVEL GAUGE SYSTEM WITH DUAL TRANSMISSION LINE PROBES FOR DIELECTRIC CONSTANT COMPENSATION

(71) Applicant: Rosemount Tank Radar AB, Mölnlycke (SE)

(72) Inventor: Mikael Eriksson, Västervik (SE)

(73) Assignee: ROSEMOUNT TANK RADAR AB, Molnlycke (SE)

( * ) Notice: Subject to any disclaimer, the term of this patent is extended or adjusted under 35 U.S.C. 154(b) by 308 days.

(21) Appl. No.: 15/281,344

(22) Filed: Sep. 30, 2016

(65) Prior Publication Data

US 2018/0094963 A1 Apr. 5, 2018

(51) Int. Cl.
*G01S 7/03* (2006.01)
*G01S 13/88* (2006.01)
(Continued)

(52) U.S. Cl.
CPC ............. *G01F 23/284* (2013.01); *G01S 7/03* (2013.01); *G01S 13/88* (2013.01); *F17C 13/02* (2013.01);
(Continued)

(58) Field of Classification Search
CPC . G01S 13/88; G01S 7/02; G01S 13/08; G01S 7/03; G01S 13/02; G01S 7/292; G01S 7/4056; G01S 13/10; G01S 13/18; H01Q 1/225; G01F 23/284; G01F 25/0061; G01F 23/268; G01F 23/266; G01F 23/14; G01F 1/662; G01F 1/708; G01F 23/0076; H01P 3/10; B65D 90/48; B01D 21/0018;
(Continued)

(56) References Cited

U.S. PATENT DOCUMENTS 6,121,780 A 9/2000 Cruickshank et al.
6,445,192 B1 * 9/2002 Lovegren ............. G01F 23/284
324/644

(Continued)

OTHER PUBLICATIONS

European Search Report from European Application No. 17191012.8, dated Feb. 23, 2018.

*Primary Examiner* — Olumide Ajibade Akonai
(74) *Attorney, Agent, or Firm* — Westman, Champlin & Koehler, P.A.

(57) ABSTRACT

A radar level gauge system comprising: a transceiver arrangement; a first probe to guide a first transmit signal through a surrounding medium towards a product in the tank, and to return a first surface echo signal, the first probe being configured to guide the first transmit signal with a first propagation velocity exhibiting a first dependence on a dielectric constant of the surrounding medium; a second probe to guide a second transmit signal through the surrounding medium towards the product, and to return a second surface echo signal, the second probe being configured to guide the second transmit signal with a second propagation velocity exhibiting a second dependence, different from the first dependence, on the dielectric constant of the surrounding medium; and processing circuitry for determining the filling level based on the first surface echo signal, the second surface echo signal, and a known relation between the first dependence and the second dependence.

15 Claims, 8 Drawing Sheets

(51) Int. Cl.
_G01F 23/284_ (2006.01)
_G01R 27/26_ (2006.01)
_H01Q 1/22_ (2006.01)
_G01F 23/00_ (2006.01)
_F17C 13/02_ (2006.01)
_G01F 23/26_ (2006.01)

(52) U.S. Cl.
CPC ........ _G01F 23/0061_ (2013.01); _G01F 23/268_ (2013.01); _G01R 27/2676_ (2013.01); _H01Q 1/225_ (2013.01)

(58) Field of Classification Search
CPC ..... F17C 13/02; G01R 27/06; G01R 27/2676; G01B 7/26
USPC ................................ 324/642, 644; 73/304 R
See application file for complete search history.

(56) References Cited

U.S. PATENT DOCUMENTS

| | | | |
|---|---|---|---|
| 6,724,197 B2 * | 4/2004 | Neven | G01F 23/284 324/642 |
| 7,525,476 B1 | 4/2009 | Delin et al. | |
| 8,701,483 B2 * | 4/2014 | Welle | G01F 23/284 73/290 R |
| 8,872,695 B2 * | 10/2014 | Edvardsson | H01Q 1/225 342/124 |
| 10,184,820 B2 * | 1/2019 | Edvardsson | G01F 23/284 |
| 2005/0179584 A1 * | 8/2005 | Ohlsson | G01F 23/284 342/124 |
| 2007/0090992 A1 | 4/2007 | Edvardsson | |
| 2009/0145219 A1 * | 6/2009 | Champion | G01F 23/284 73/304 C |
| 2009/0151446 A1 * | 6/2009 | Champion | G01F 23/268 73/291 |
| 2012/0319891 A1 | 12/2012 | Edvardsson et al. | |
| 2012/0324994 A1 * | 12/2012 | Welle | G01F 23/284 73/290 V |
| 2013/0320145 A1 * | 12/2013 | McGillis | G01F 23/284 244/134 C |
| 2014/0085130 A1 * | 3/2014 | Edvardsson | G01F 23/284 342/124 |
| 2015/0226594 A1 * | 8/2015 | Frovik | G01F 23/284 342/124 |
| 2017/0336238 A1 * | 11/2017 | Osswald | G01F 23/284 |

\* cited by examiner

GUIDED WAVE RADAR LEVEL GAUGE SYSTEM WITH DUAL TRANSMISSION LINE PROBES FOR DIELECTRIC CONSTANT COMPENSATION

TECHNICAL FIELD OF THE INVENTION

The present invention relates to a guided wave radar level gauge system and to a method of determining a filling level of a product in a tank.

TECHNICAL BACKGROUND

Radar level gauge systems are in wide use for measuring process variables of products contained in tanks, such as filling level, temperature, pressure etc. Radar level gauging is generally performed either by means of non-contact measurement, whereby electromagnetic signals are radiated towards the product contained in the tank, or by means of contact measurement, often referred to as guided wave radar (GWR), whereby electromagnetic signals are guided towards and into the product by a transmission line probe. The transmission line probe is generally arranged vertically from top to bottom of the tank. The electromagnetic signals are subsequently reflected at the surface of the product, and the reflected signals are received by a receiver or transceiver comprised in the radar level gauge system. Based on the transmitted and reflected signals, the distance to the surface of the product can be determined.

More particularly, the distance to the surface of the product is generally determined based on the time between transmission of an electromagnetic signal and reception of the reflection thereof in the interface between the atmosphere in the tank and the product contained therein (and/or in another material interface in the tank). In order to determine the actual filling level of the product, the distance from a reference position to the surface is determined based on the above-mentioned time (the so-called time-of-flight) and the propagation velocity along the probe of the electromagnetic signals.

This propagation velocity is influenced by various factors, such as the configuration of the transmission line probe and environmental conditions inside the tank. Such environmental conditions, for example, include the composition of the atmosphere above the surface of the product contained in the tank, and product residue which may have adhered to the probe as the filling level of the product changes inside the tank.

In boiler applications, for example, the atmosphere inside the boiler tank may be steam under high pressure, in which case the difference in dielectric constant may be quite large for different operating conditions.

U.S. Pat. No. 7,525,476 discloses a guided wave radar level gauge system in which reference reflectors are provided at known positions along the transmission line probe and in which the difference between the measured distance and the known distance between a pair of reference reflectors is used to compensate for variations in propagation velocity caused by variations in the propagation conditions along the transmission line probe.

Although allowing for a more accurate filling level determination in applications with varying propagation properties inside the tank, the reference reflectors reflect a portion of the signal, which means that there is some reduction in the sensitivity of the radar level gauge system as compared to a corresponding guided wave radar level gauge system without reference reflectors.

SUMMARY OF THE INVENTION

In view of the above, it would be desirable to provide a guided wave radar level gauge system in which accurate filling level determination can be achieved in applications with varying propagation properties without the need for providing reference reflectors along the transmission line probe.

According to a first aspect of the present invention, it is therefore provided a radar level gauge system, for determining a filling level of a product in a tank, the radar level gauge system comprising: a transceiver arrangement for generating, transmitting and receiving electromagnetic signals; a first transmission line probe arranged and configured to guide an electromagnetic first transmit signal from the transceiver arrangement through a surrounding medium towards the product inside the tank, and to return an electromagnetic first surface echo signal resulting from reflection of the first transmit signal by a surface of the product back towards the transceiver arrangement, the first transmission line probe being configured to guide the first transmit signal with a first propagation velocity exhibiting a first dependence on a dielectric constant of the surrounding medium; a second transmission line probe arranged and configured to guide an electromagnetic second transmit signal from the transceiver arrangement through the surrounding medium towards the product inside the tank, and to return an electromagnetic second surface echo signal resulting from reflection of the second transmit signal by the surface of the product back towards the transceiver arrangement, the second transmission line probe being configured to guide the second transmit signal with a second propagation velocity exhibiting a second dependence, different from the first dependence, on the dielectric constant of the surrounding medium; and processing circuitry connected to the transceiver arrangement for determining the filling level based on the first surface echo signal, the second surface echo signal, and a known relation between the first dependence and the second dependence on the dielectric constant of the surrounding medium.

The known relation between the first dependence and the second dependence may, for example, be the ratio between the first dependence and the second dependence, or, in other words, the dependence of the ratio between the first propagation velocity and the second propagation velocity on the dielectric constant of the surrounding medium.

The tank may be any container or vessel capable of containing a product, and may be metallic, or partly or completely non-metallic, open, semi-open, or closed.

The present invention is based upon the realization that filling level determination that does not require detailed knowledge of the dielectric constant above the level to be gauged can be achieved using two different transmission line probes providing different coupling efficiencies between the respective transmit signals and the surrounding medium.

In particular, this can be achieved without the need for different propagation modes and/or different frequency ranges for the two transmission line probes, which provides for simplified signal generation and coupling.

The dependence of the propagation velocities on the dielectric constant of the surrounding medium for the first and second transmission line probes, respectively, may for example be empirically determined, or be calculated or modeled. Depending on the actual configurations of the transmission line probes, it may be feasible to determine an equation specifying the propagation velocity as a function of the dielectric constant of the surrounding medium and known properties of the transmission line probes.

For ease of installation and use, the first transmission line probe and the second transmission line probe may be arranged so that they can be inserted in the tank through the same opening in the roof of the tank. Advantageously, the first transmission line probe and the second transmission line probe may extend substantially in parallel from the tank ceiling to the surface of the product in the tank and beyond.

According to various embodiments of the guided wave radar level gauge system according to the present invention, the first transmission line probe may comprise a first transmission line probe conductor and a first dielectric enclosing structure at least partly enclosing said first transmission line probe conductor.

Examples of such transmission line probes are described in detail in US 2007/0090992, which is hereby incorporated by reference in its entirety.

The dielectric enclosing structure may advantageously extend along a substantial portion of the transmission line probe, such as along the entire length of the transmission line probe arranged inside the tank.

This type of the transmission line probe will in the following be referred to as a Partially External Dielectric (PED) transmission line probe.

The propagation velocity along the PED transmission line probe is characterized by an effective dielectric constant $\varepsilon_{eff}$ which depends on the dielectric constant of the dielectric enclosing structure $\varepsilon_{int}$ and the dielectric constant of the surrounding medium (air, steam, product vapor, probe contamination etc) $\varepsilon_{ext}$. The propagation velocity of the electromagnetic signal traveling along the transmission line probe is given by the velocity of light divided by the square root of the effective dielectric constant $\varepsilon_{eff}$.

The effective dielectric constant $\varepsilon_{eff}$ of the PED transmission line probe depends on the dielectric constant of the dielectric enclosing structure $\varepsilon_{int}$ and the dielectric constant of the surrounding medium $\varepsilon_{ext}$ according to the following relation:

$$\varepsilon_{eff} \sim \frac{1}{\frac{\alpha}{\varepsilon_{ext}} + \frac{1-\alpha}{\varepsilon_{int}}}$$

where $\alpha$ is a number between 0 and 1 which indicates the degree of coupling to the surrounding medium. With $\alpha=1$, we have naked wires (and maximum influence of the surrounding medium) and with $\alpha=0$ we have a line fully screened from the surrounding medium (such as a dosed coaxial line).

Since $\varepsilon_{eff}$ determines the propagation velocity along the transmission line probe, the first and second transmission line probes may advantageously be configured to exhibit different values of a for the same propagation mode and frequency range.

For example, the first transmission line probe may exhibit a first coupling factor $\alpha_1$, and the second transmission line probe may exhibit a second coupling factor $\alpha_2$. This may, for instance, be achieved by only at least partly enclosing the first transmission line probe conductor of the first transmission line probe by the above-mentioned first dielectric enclosing structure having a first dielectric constant $\varepsilon_{int,1}$. In such embodiments, the second transmission line probe may completely lack a dielectric enclosing structure. In other embodiments, the second transmission line probe may comprise a second transmission line probe conductor and a second dielectric enclosing structure at least partly enclosing the second transmission line probe conductor. This second dielectric enclosing structure may have a second dielectric constant $\varepsilon_{int,2}$, that may differ from the above-mentioned first dielectric constant $\varepsilon_{int,1}$.

By using first and second transmission line probes with different (and known) values of the coupling coefficient $\alpha$ and/or different dielectric materials with different (and known) dielectric constants $\varepsilon_{int}$, the unknown dielectric constant $\varepsilon_{ext}$ of the surrounding medium can be determined, which means that the filling level can be determined accurately without prior knowledge of the dielectric constant of the surrounding medium in the tank.

In embodiments, the first and second transmission line probes may be of the same general type, such as single conductor probes, coaxial probes, or twin-line probes etc. In other embodiments, the the first and second transmission line probes may be of different general types. For instance, the first transmission line probe may be a single conductor probe, and the second transmission line probe may be a coaxial probe.

According to various embodiments, furthermore, the transceiver arrangement may be arranged on an outside of the tank; and the radar level gauge system may further comprise a tank feed-through arrangement for electrically connecting the transceiver arrangement with the first transmission line probe and the second transmission line probe, which are arranged inside the tank.

In embodiments, the above-mentioned feed-through arrangement may comprise a first feed-through for the first transmission line probe, and a second feed-through for the second transmission line probe.

The transceiver arrangement may comprise a first transceiver connected to the first transmission line probe through the first feed-through; and a second transceiver connected to the second transmission line probe through the second feed-through.

Alternatively, the transceiver arrangement may comprise a common transceiver; and the radar level gauge system may further comprise a signal routing arrangement connected to the first feed-through, the second feed-through, and the common transceiver for allowing the common transceiver to be connected to the first transmission line probe and the second transmission line probe in sequence.

The signal routing arrangement may, for example, comprise a microwave switch.

According to other embodiments, the feed-through arrangement may comprise a common feed-through; the transceiver arrangement may comprise a common transceiver connected to the common feed-through for providing a common transmit signal to the common feed-through; and the radar level gauge system may further comprise a power divider arranged inside the tank and connected to the first transmission line probe, the second transmission line probe, and the common feed-through for: dividing a common transmit signal provided by the common transceiver into the first transmit signal and the second transmit signal; providing the first transmit signal to the first transmission line probe; providing the second transmit signal to the second transmission line probe; and combining the first surface echo signal and the second surface echo signal to a common surface echo signal.

In either case, a "transceiver" may be one functional unit capable of transmitting and receiving electromagnetic signals, or may be a system comprising separate transmitter and receiver units.

In the embodiments with a common transceiver and a power divider, the transceiver arrangement may further comprise measurement signal forming circuitry for forming a measurement signal based on the common surface echo signal and a timing relation between the common transmit signal and the common surface echo signal, the measurement signal comprising a first set of echo indicators indicating reflection of the first transmit signal at impedance discontinuities encountered by the first transmit signal, and a second set of echo indicators indicating reflection of the second transmit signal at impedance discontinuities encountered by the first transmit signal.

Additionally, the processing circuitry may comprise echo identifying circuitry connected to the measurement signal forming circuitry for identifying the first set of echo indicators and the second set of echo indicators in the measurement signal; and level determining circuitry connected to the echo identifying circuitry for determining the filling level based on at least one echo indicator from the first set of echo indicators, and at least one echo indicator from the second set of echo indicators.

According to a second aspect of the present invention, it is provided a method of determining a filling level of a product in a tank using a radar level gauge system comprising a transceiver arrangement, a first transmission line probe configured to guide a given electromagnetic signal through a surrounding medium with a first propagation velocity exhibiting a first dependence on a dielectric constant of the surrounding medium, a second transmission line probe configured to guide the given electromagnetic signal through the surrounding medium with a second propagation velocity exhibiting a second dependence, different from the first dependence, on the dielectric constant of the surrounding medium, and processing circuitry for determining the filling level, the method comprising the steps of: propagating, by the first transmission line probe, an electromagnetic first transmit signal originating from the transceiver towards a surface of the product in the tank; propagating, by the first transmission line probe, an electromagnetic first surface echo signal signal resulting from reflection of the first transmit signal at the surface back towards the transceiver; receiving, by the transceiver, the first surface echo signal; propagating, by the second transmission line probe, an electromagnetic second transmit signal originating from the transceiver towards a surface of the product in the tank; propagating, by the second transmission line probe, an electromagnetic second surface echo signal signal resulting from reflection of the second transmit signal at the surface back towards the transceiver; receiving, by the transceiver, the second surface echo signal; determining, by the processing circuitry, the filling level based on the first surface echo signal, the second surface echo signal, and a known relation between the first dependence and the second dependence on the dielectric constant of the surrounding medium.

Further embodiments of, and effects obtained through this second aspect of the present invention are largely analogous to those described above for the first aspect of the invention.

In summary, the present invention thus relates to a radar level gauge system comprising: a transceiver arrangement; a first probe to guide a first transmit signal through a surrounding medium towards a product in the tank, and to return a first surface echo signal, the first probe being configured to guide the first transmit signal with a first propagation velocity exhibiting a first dependence on a dielectric constant of the surrounding medium; a second probe to guide a second transmit signal through the surrounding medium towards the product, and to return a second surface echo signal, the second probe being configured to guide the second transmit signal with a second propagation velocity exhibiting a second dependence, different from the first dependence, on the dielectric constant of the surrounding medium; and processing circuitry for determining the filling level based on the first surface echo signal, the second surface echo signal, and a known relation between the first dependence and the second dependence.

BRIEF DESCRIPTION OF THE DRAWINGS

These and other aspects of the present invention will now be described in more detail, with reference to the appended drawings showing example embodiments of the invention, wherein.

DETAILED DESCRIPTION OF AN EXAMPLE EMBODIMENT OF THE INVENTION

In the present detailed description, reference is mainly made to filling level determination by means of measuring the time between transmitted and reflected pulses. As is, however, evident to the person skilled in the relevant art, the teachings of the present invention are equally applicable to radar level gauge systems utilizing phase information for determining the filling level through, for example, frequency-modulated continuous wave (FMCW) measurements. When pulses modulated on a carrier are used, phase information can also be utilized.

Figure 1:
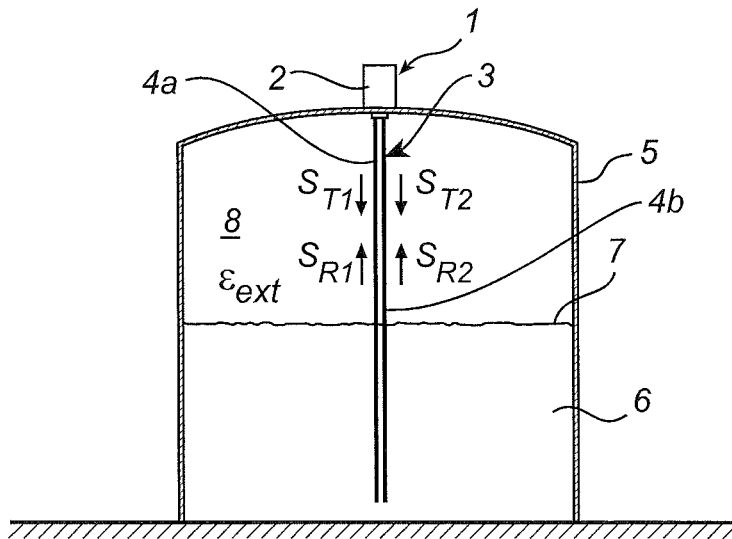
FIG. 1 schematically illustrates a guided wave radar level gauge system according to an embodiment of the present invention installed at an exemplary tank.

FIG. 1 schematically illustrates a radar level gauge system 1 according to an embodiment of the present invention, comprising a measurement electronics unit 2, and a transmission line probe arrangement 3 including a first transmission line probe 4a and a second transmission line probe 4b. The radar level gauge system 1 is provided at a tank 5, which is partly filled with a product 6 to be gauged. The first transmission line probe 4a and the second transmission line probe 4b are configured to guide identical electromagnetic signals differently through a surrounding medium. In particular, the relation between the propagation speed of the electromagnetic signal and the dielectric constant $\varepsilon_{ext}$ of the surrounding medium 8 is different for the first 4a and second 4b transmission line probes.

By guiding an electromagnetic first transmit signal $S_{T1}$ towards the surface 7 of the product 6 using the first transmission line probe 4a and an electromagnetic second transmit signal $S_{T2}$ towards the surface 7 of the product 6 using the second transmission line probe 4b as is schematically indicated in FIG. 1, and analyzing an electromagnetic first surface reflection signal $S_{R1}$ and an electromagnetic second surface reflection signal $S_{R2}$ traveling back from the surface 7, the measurement electronics unit 2 can determine the distance between a reference position (such as the tank ceiling) and the surface 7 of the product 6, whereby the filling level can be deduced even if the dielectric constant $\varepsilon_{ext}$ of the medium 8 in the tank surrounding the transmission line probe 3 is unknown and/or varying. It should be noted that, although a tank 5 containing a single product 6 is discussed herein, the distance to any material interface along the probe can be measured in a similar manner.

Figure 2A:
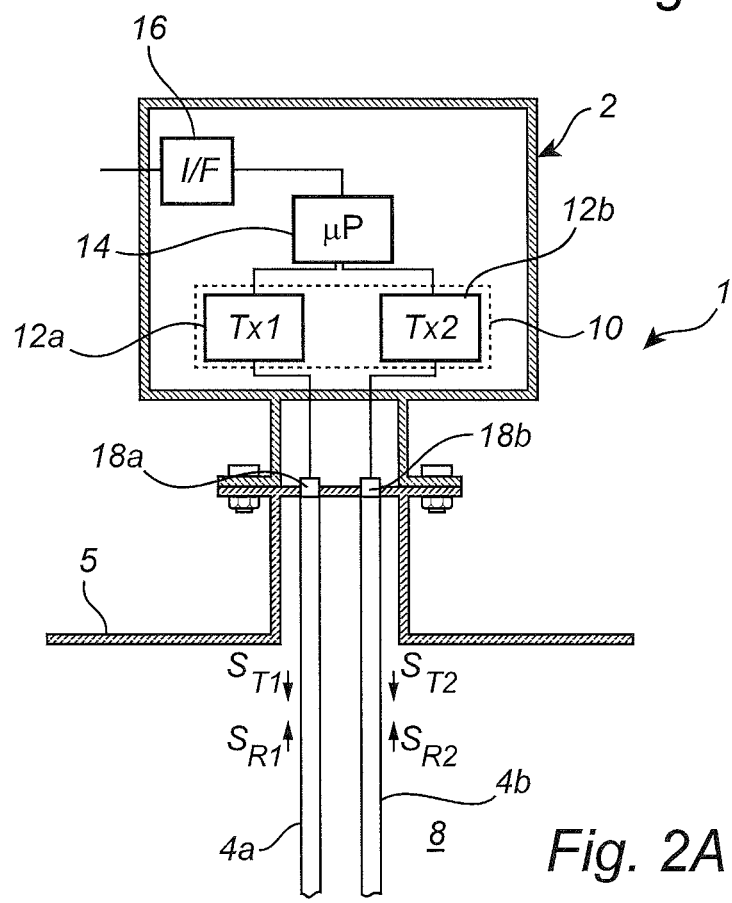
FIG. 2A is a schematic functional illustration of a first embodiment of the guided wave radar level gauge system in FIG. 1.

A first embodiment of the radar level gauge system 1 according to the present invention will now be described with reference to the schematic illustration in FIG. 2A. As is functionally indicated in FIG. 2A, the radar level gauge system 1 comprises, in the measurement electronics unit 2, a transceiver arrangement 10 including a first transceiver 12a and a second transceiver 12b, processing circuitry 14, and a communication interface 16 for allowing communication with an external system. As is also schematically shown in FIG. 2A, the radar level gauge system 1 comprises a feed-through arrangement including a first feed-through 18a and a second feed-through 18b. In the embodiment of FIG. 2A, the first transceiver 12a is connected to the first transmission line probe 4a through the first feed-through 18a, and the second transceiver 12b is connected to the second transmission line probe 4b through the second feed-through 18b.

It should be understood that each feed-through provides separation between the inside of the tank 5 and the outside of the tank 5, while allowing propagation of the transmit signals $S_{T1}$, $S_{T2}$ and surface echo signals $S_{R1}$, $S_{R2}$ between the transceiver arrangement 10 and the first 4a and second 4b transmission line probes.

Figure 2B:
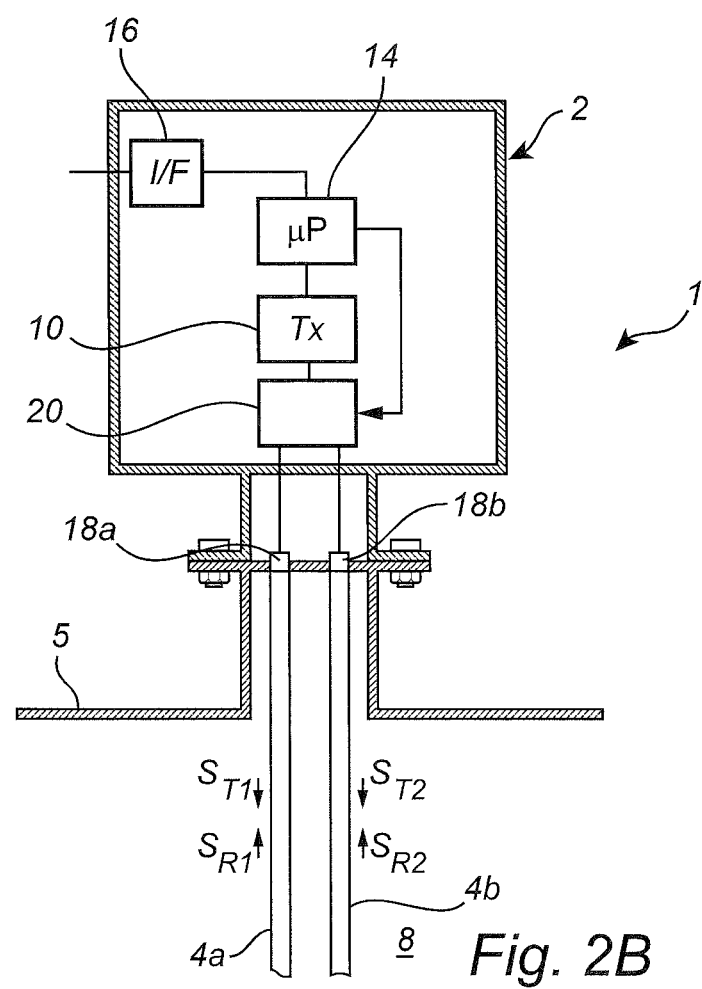
FIG. 2B is a schematic functional illustration of a second embodiment of the guided wave radar level gauge system in FIG. 1.

A second embodiment of the radar level gauge system 1 according to the present invention will now be described with reference to the schematic illustration in FIG. 2B. As can be seen in FIG. 2B, the second embodiment of the radar level gauge system 1 according to the present invention differs from the first embodiment described above with reference to FIG. 2A in that the transceiver arrangement 10 comprises a single transceiver, and that this transceiver 10 is connected to the first feed-through 18a and the second feed-through 18b via a controllable signal routing arrangement 20. By controlling the signal routing arrangement 20, which may for example be a microwave switch or similar, using the processing circuitry 14 as is schematically indicated in FIG. 2B, signals from the transceiver 10 can first be provided to and received from the first transmission line probe 4a, and then provided to and received from the second transmission line probe 4b. Although, in this embodiment, signals cannot be provided to the first transmission line probe 4a and the second transmission line probe 4b simultaneously, it can be assumed that the electric properties of the surrounding medium 8 as well as the vertical position of the surface 7 of the product 6 in the tank 5 will be substantially identical for the measurement operations using the respective transmission line probes. The implementation of the signal routing arrangement 20 maybe somewhat different depending on the frequency range of the electromagnetic signals generated by the transceiver 10. It will be straight-forward to the skilled person to design a suitable and functional signal routing arrangement 20 for the relevant frequency range.

Figure 2C:
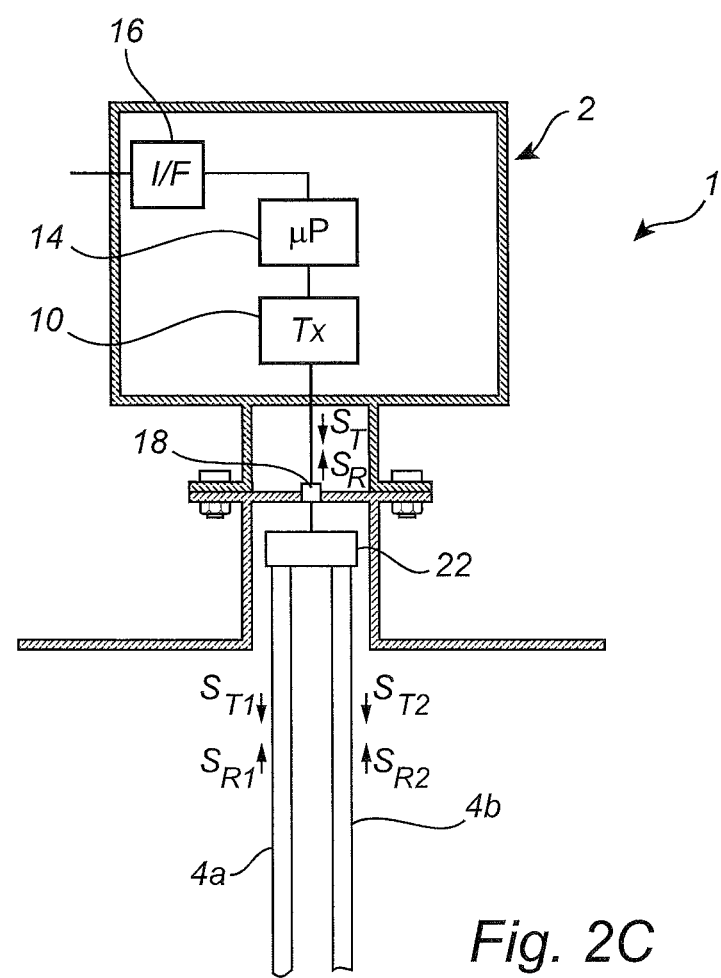
FIG. 2C is a schematic functional illustration of a third embodiment of the guided wave radar level gauge system in FIG. 1.

A third embodiment of the radar level gauge system 1 according to the present invention will now be described with reference to the schematic illustration in FIG. 2C. As can be seen in FIG. 2C, the third embodiment of the radar level gauge system 1 according to the present invention mainly differs from the second embodiment described above with reference to FIG. 2B in that there is a single feed-through 18 for feeding both the first transmission line probe 4a and the second transmission line probe 4b, via a power divider 22 arranged inside the tank 5. The power divider 22, which may for instance be realized in the form of a, per se, known wilkinson power divider, divides a common transmit signal $S_T$ from the transceiver 10 into the first transmit signal $S_{T1}$ and the second transmit signal $S_{T2}$, and provides the first transmit signal $S_{T1}$ to the first transmission line probe 4a and the second transmit signal $S_{T2}$ to the second transmission line probe 4b, as is schematically indicated in FIG. 2C.

In this embodiment, the first surface echo signal $S_{R1}$ and the second surface echo signal $S_{R2}$ will be combined to a common or combined surface echo signal $S_R$ as is schematically indicated in FIG. 2C. To be able to fully use the information carried by the combined surface echo signal $S_R$, the radar level gauge system 1 should be able to discriminate at least a first surface echo indication that is based on the first surface echo signal $S_{R1}$ and a second surface echo indication that is based on the second surface echo signal $S_{R2}$. This means that it may be desirable to configure the first transmission line probe 4a and the second transmission line probe 4b to guide electromagnetic signals with substantially different propagations speeds, so that the respective surface echoes are sufficiently separated in time. This consideration mainly applies to the present third embodiment of the invention.

Figure 3:
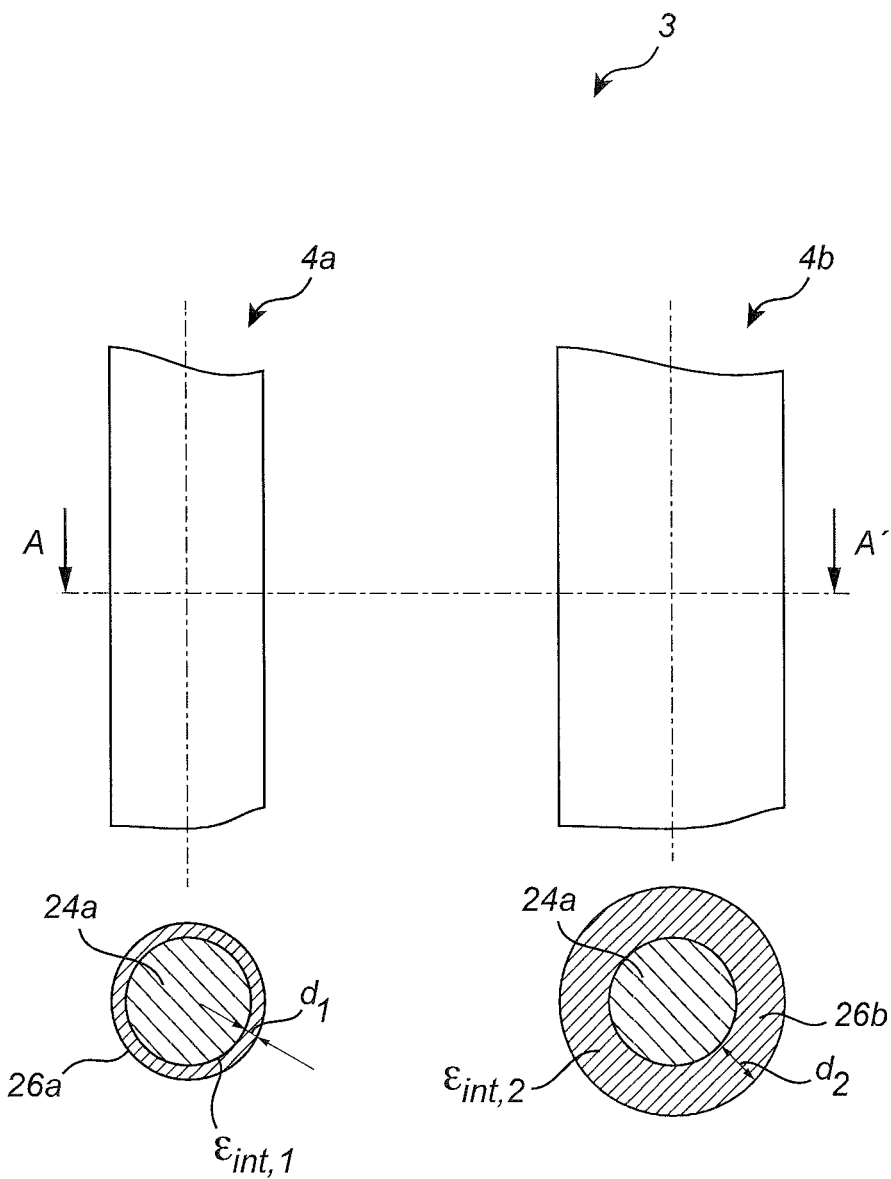
FIG. 3 schematically shows a first exemplary transmission line probe configuration.

Referring first to FIG. 3, a portion of an example configuration of the probe arrangement 3 is schematically shown, including both the first transmission line probe 4a and the second transmission line probe 4b in a schematic side view, and in a cross-section view in the plane indicated by A-A' in FIG. 3.

In the example probe arrangement configuration schematically shown in FIG. 3, the first transmission line probe 4a comprises a first transmission line probe conductor 24a, and a first dielectric enclosing structure 26a at least partly enclosing the first transmission line probe conductor 24a. Similarly, the second transmission line probe 4b comprises a second transmission line probe conductor 24b, and a second dielectric enclosing structure 26b at least partly enclosing the second transmission line probe conductor 24b.

In the exemplary probe arrangement configuration in FIG. 3, the first dielectric enclosing structure 26a is provided in the form of a first dielectric sleeve that completely encloses the first probe conductor 24a. The first dielectric sleeve 26a has a first thickness $d_1$, and a first relative dielectric constant $\varepsilon_{int,1}$. The second dielectric enclosing structure 26b is provided in the form of a second dielectric sleeve that completely encloses the second probe conductor 24b. The second dielectric sleeve 26b has a second thickness $d_2$, and a second relative dielectric constant $\varepsilon_{int,2}$. In some embodiments, the first dielectric sleeve 26a and the second dielectric sleeve 26b may be made of the same dielectric material, so that the first relative dielectric constant $\varepsilon_{int,1}$ and the second relative dielectric constant $\varepsilon_{int,2}$ are identical. The dielectric material may, for instance, be PTFE (polytetrafluoroethylene) having a relative dielectric constant of about 2.0-2.1.

It should be noted that the probe conductors of the transmission line probes 4a-b may be at least partly enclosed by different dielectric materials. Moreover, one of the probe conductors may be uncoated.

As is mentioned above in the Summary section, the effective dielectric constant $\varepsilon_{eff}$ of each of the transmission line probes 4a-b depends on the dielectric constant of the respective dielectric enclosing structure $\varepsilon_{int}$ and the dielectric constant $\varepsilon_{ext}$ of the surrounding medium 8 according to the following relation:

$$\varepsilon_{eff} \sim \frac{1}{\frac{\alpha}{\varepsilon_{ext}} + \frac{1-\alpha}{\varepsilon_{int}}}$$

where $\alpha$ is a number between 0 and 1 which indicates the degree of coupling to the surrounding medium 8. Moreover, the propagation velocity is inversely proportional to the square root of the effective dielectric constant $\varepsilon_{eff}$.

In this case, the first coupling factor $\alpha_1$ for the first transmission line probe 4a will depend on the first thickness $d_1$, and the second coupling factor $\alpha_2$ for the second transmission line probe 4b will depend on the second thickness $d_2$.

Figure 4:
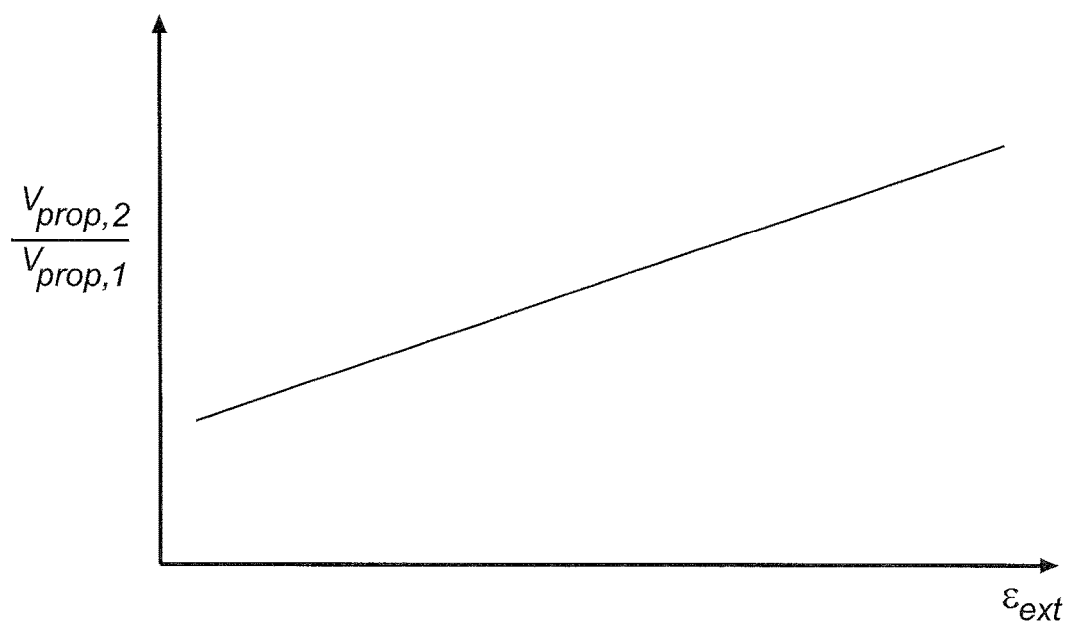
FIG. 4 is a diagram schematically illustrating the ratio between the propagation velocities along the two different transmission line probes as a function of the dielectric constant of the surrounding medium.

To illustrate the resulting dependence of the propagation velocity on the dielectric constant $\varepsilon_{ext}$ of the surrounding medium 8, a diagram with the ratio between the propagation velocities for the first 4a and second 4b transmission line probes as a function of the dielectric constant $\varepsilon_{ext}$ of the surrounding medium 8 is provided in FIG. 4. For the exemplary case illustrated in FIG. 4, the coupling factor $\alpha_1$ for the first transmission line probe 4a is 0.75, and the coupling factor $\alpha_2$ for the second transmission line probe 4b is 0.5.

Many different transmission line probe arrangement configurations can be used to achieve the desired different dependence of propagation velocity on dielectric constant $\varepsilon_{ext}$ of the surrounding medium 8. One additional example of such a transmission line probe arrangement configuration will be described below with reference to FIG. 5 schematically showing a second exemplary transmission line probe arrangement configuration.

Figure 5:
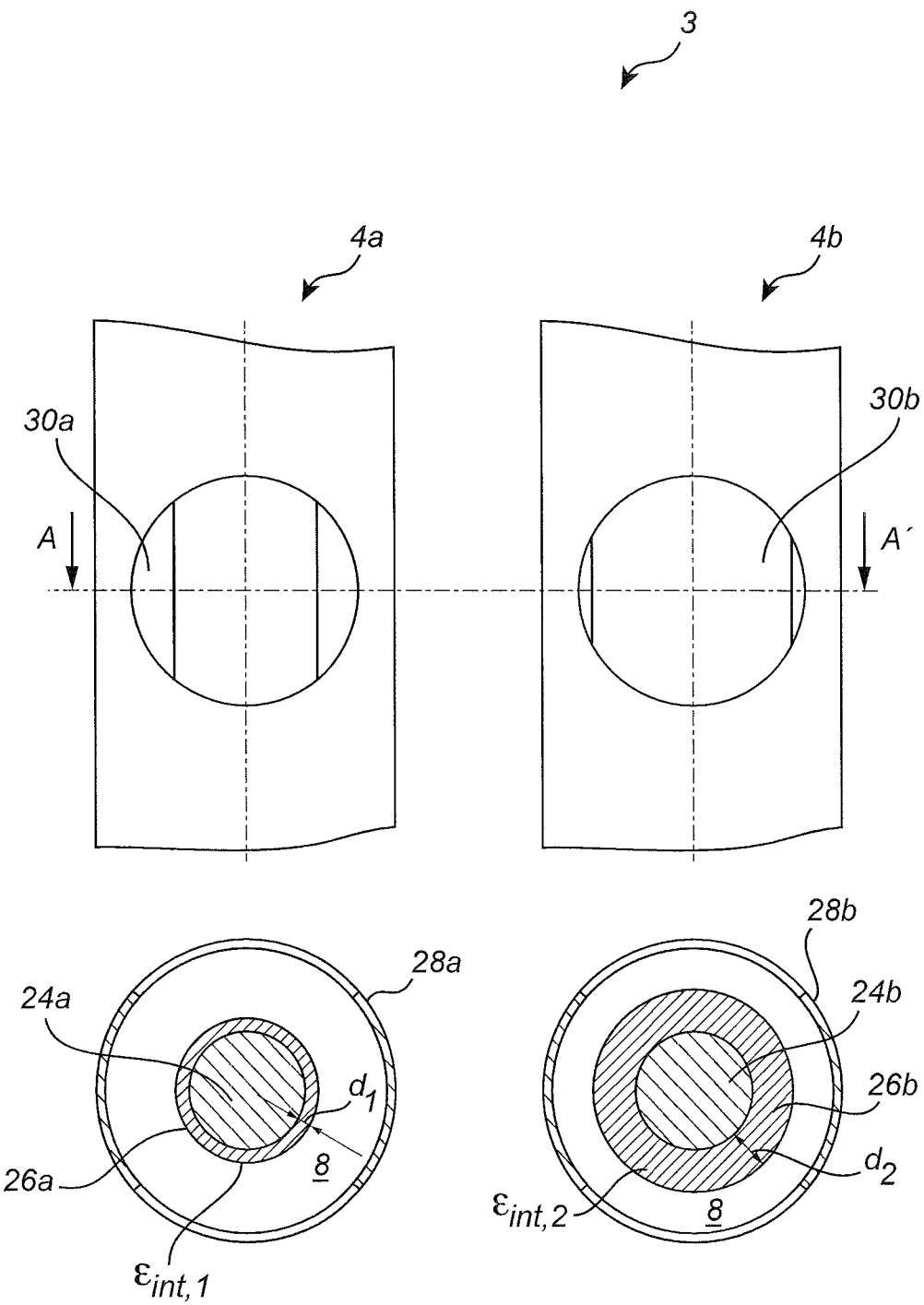
FIG. 5 schematically shows a second exemplary transmission line probe configuration.

Referring first to FIG. 5, a portion of a second example configuration of the probe arrangement 3 is schematically shown, including both the first transmission line probe 4a and the second transmission line probe 4b in a schematic side view, and in a cross-section view in the plane indicated by A-A' in FIG. 5.

In the example probe arrangement configuration schematically shown in FIG. 5, the first transmission line probe 4a comprises a first transmission line probe conductor 24a, a first dielectric enclosing structure 26a at least partly enclosing the first transmission line probe conductor 24a, and a first shielding conductor 28a. As is schematically shown in FIG. 5, the first shielding conductor 28a has openings 30a for allowing entry of product 6 (and the surrounding medium 8) to the space between the first transmission line probe conductor 24a and the first shielding conductor 28a. Similarly, the second transmission line probe 4b comprises a second transmission line probe conductor 24b, and a second dielectric enclosing structure 26b at least partly enclosing the second transmission line probe conductor 24b, and a second shielding conductor 28b. As is schematically shown in FIG. 5, the second shielding conductor 28b has openings 30b for allowing entry of product 6 (and the surrounding medium 8) to the space between the second transmission line probe conductor 24b and the second shielding conductor 28b.

In the exemplary probe arrangement configuration in FIG. 5, the first dielectric enclosing structure 26a is provided in the form of a first dielectric sleeve that completely encloses the first probe conductor 24a. The first dielectric sleeve 26a has a first thickness $d_1$, and a first relative dielectric constant $\varepsilon_{int,1}$. The second dielectric enclosing structure 26b is provided in the form of a second dielectric sleeve that completely encloses the second probe conductor 24b. The second dielectric sleeve 26b has a second thickness $d_2$, and a second relative dielectric constant $\varepsilon_{int,2}$. In some embodiments, the first dielectric sleeve 26a and the second dielectric sleeve 26b may be made of the same dielectric material, so that the first relative dielectric constant $\varepsilon_{int,1}$ and the second relative dielectric constant $\varepsilon_{int,2}$ are identical. The dielectric material may, for instance, be PTFE (polytetrafluoroethylene) having a relative dielectric constant of about 2.0-2.1.

As noted above in connection with the first exemplary transmission line probe arrangement configuration, the probe conductors of the transmission line probes 4a-b may be at least partly enclosed by different dielectric materials. Moreover, one of the probe conductors may be uncoated. Alternatively, or in combination, the inner surface of one or both of the shielding conductors 28a-b may be coated with dielectric material.

Figure 6:
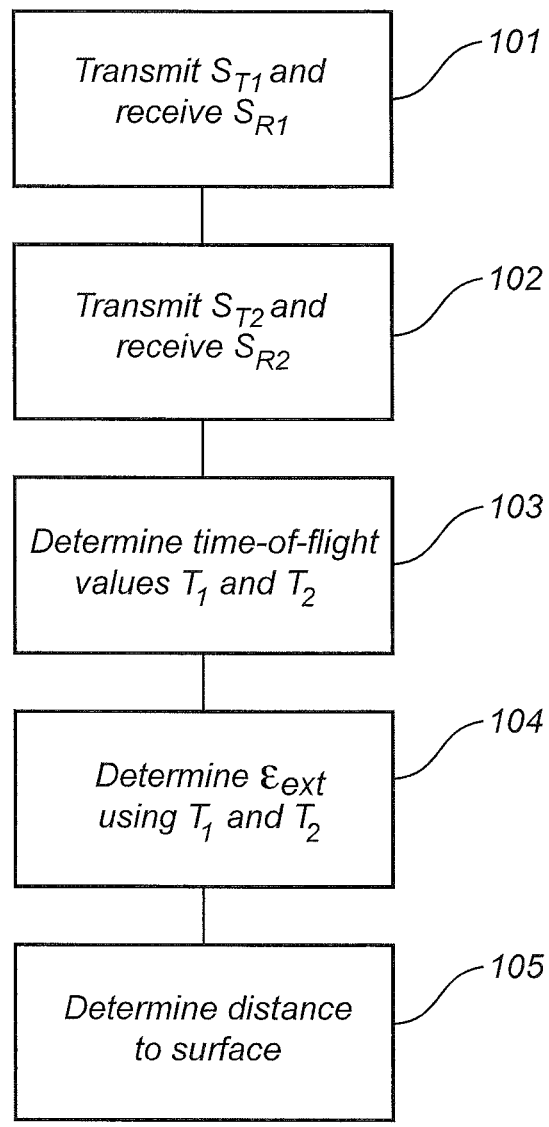
FIG. 6 is a flow-chart schematically illustrating an example embodiment of the method according to the present invention.

An example embodiment of the filling level determination method according to embodiments of the present invention will now be described with reference to the flow chart in FIG. 6 as well as to FIG. 1 and FIGS. 2A-C.

In a first step 101, an electromagnetic first transmit signal $S_{T1}$ generated by the transceiver arrangement 10 is propagated towards the surface 7 of the product 6 using the first transmission line probe 4a, and an electromagnetic first surface echo signal $S_{R1}$ resulting from reflection of the first transmit signal $S_{T1}$ at the surface 7 is returned to the transceiver arrangement 10, where it is received.

In a second step 102, an electromagnetic second transmit signal $S_{T2}$ generated by the transceiver arrangement 10 is propagated towards the surface 7 of the product 6 using the second transmission line probe 4b, and an electromagnetic second surface echo signal $S_{R2}$ resulting from reflection of the second transmit signal $S_{T2}$ at the surface 7 is returned to the transceiver arrangement 10, where it is received.

Subsequently, in step 103, the time-of-flight (or a value indicative of the time-of-flight) $T_1$ for the first transmit signal $S_{T1}$ and the time-of-flight (or a value indicative of the time-of-flight) $T_2$ for the second transmit signal $S_{T2}$ are determined.

In the next step 104, the dielectric constant $\varepsilon_{ext}$ of the surrounding medium 8 is determined using the time-of-flight values $T_1$, $T_2$ determined in step 103 and the known relation between the time-of-flight and the dielectric constant $\varepsilon_{ext}$ of the surrounding medium 8 for the two transmission line probes 4a-b:

$$\varepsilon_{eff} \sim \frac{1}{\frac{\alpha}{\varepsilon_{ext}} + \frac{1-\alpha}{\varepsilon_{int}}}$$

Since the propagation velocity $v_{prop}$ is determined by the following relation:

$$v_{prop} = \frac{v_0}{\sqrt{\varepsilon_{eff}}},$$

where $v_0$ is the propagation velocity of electromagnetic signals along the probe in vacuum, the time-of-flight is proportional to $\sqrt{\varepsilon_{eff}}$.

Once the dielectric constant $\varepsilon_{ext}$ of the surrounding medium 8 has been determined, the effective dielectric constant $\varepsilon_{eff}$ can be determined, after which a DC-corrected (dielectric constant corrected) distance to the surface 7 of the product 6 is determined in step 105.

In order to use the method according to various embodiments of the present invention, the relationship between the propagation velocity (or time-of-flight) and the dielectric constant $\varepsilon_{ext}$ of the surrounding medium 8 should be known for propagation along the first transmission line probe 4a and the second transmission line probe 4b. This relationship can, for example, be determined by simulations based on the configurations of the transmission line probes 4a-b (materials, dimensions etc) and/or measurements, and may be embodied as a mathematical formula or as a lookup table, or a combination of those. Such simulations and/or measurements will be well within the reach of those skilled in the art to carry out without undue burden.

Figure 7:
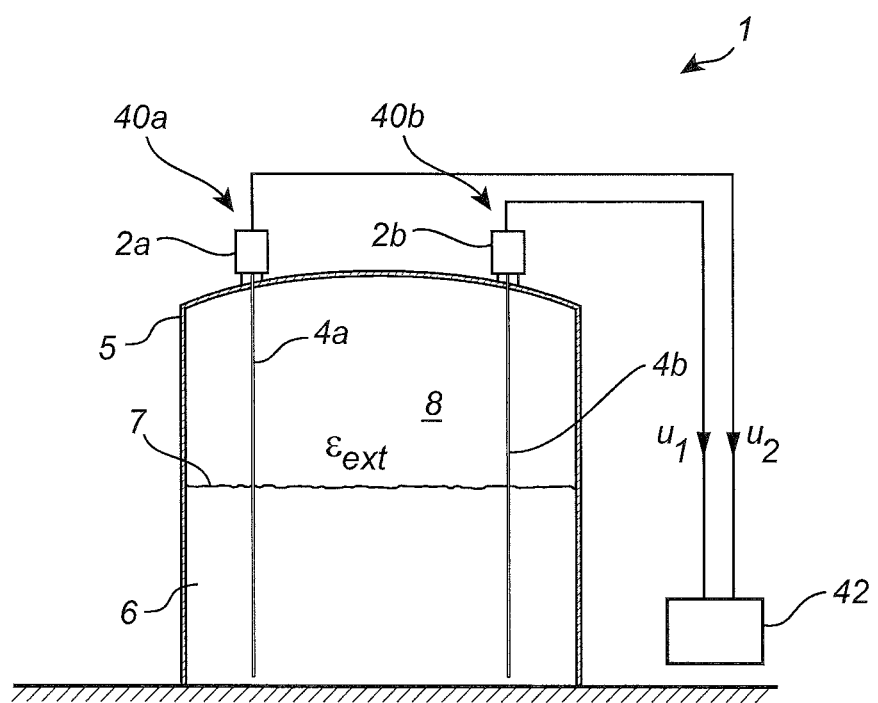
FIG. 7 schematically illustrates a guided wave radar level gauge system according to another embodiment of the present invention installed at an exemplary tank.

A further embodiment of the radar level gauge system according to the present invention will now be described with reference to FIG. 7. As can be seen in FIG. 7, the radar level gauge system 1 comprises a first level gauging unit 40a and a second level gauging unit 40b. The first level gauging unit 40a comprises a first measurement electronics unit 2a and the above-described first transmission line probe 4a, and the second level gauging unit 40b comprises a second measurement electronics unit 2b and the above-described second transmission line probe 4b.

In the embodiment in FIG. 7, the first measurement electronics unit 2a comprises a first transceiver (not shown in FIG. 7), and the second measurement electronics unit 2a comprises a second transceiver (not shown in FIG. 7). The processing circuitry of the radar level gauge system 1 is distributed among the first measurement electronics unit 2a, the second measurement electronics unit 2b, and a remote computer 42.

As is schematically indicated in FIG. 7, the first level gauging unit 40a determines a first indication of the filling level, here indicated as a first ullage $u_1$, based on signal propagation along the first transmission line probe 4a. The second level gauging unit 40b determines a second indication of the filling level, here indicated as a second ullage $u_2$, based on signal propagation along the second transmission line probe 4b. The remote computer 42 comprised in the radar level gauge system 1 receives signals indicative of the first ullage $u_1$ and the second ullage $u_2$, and determines a vapor compensated filling level based on the first ullage $u_1$, the second ullage $u_2$ and known signal propagation properties of the first transmission line probe 4a and the second transmission line probe 4b.

The person skilled in the art realizes that the present invention by no means is limited to the preferred embodiments described above. For example, other transmission line probe arrangement configurations may be used, such as twin line transmission line probes etc. Furthermore, different dielectric materials may be used for the different probes.

What is claimed is:

1. A radar level gauge system, for determining a filling level of a product in a tank, said radar level gauge system comprising:

a transceiver arrangement for generating, transmitting and receiving electromagnetic signals;

a first transmission line probe arranged and configured to guide an electromagnetic first transmit signal from said transceiver arrangement through a surrounding medium towards said product inside the tank, and to return an electromagnetic first surface echo signal resulting from reflection of said first transmit signal by a surface of said product back towards said transceiver arrangement, the first transmission line probe being configured to guide said first transmit signal with a first propagation velocity exhibiting a first dependence on a dielectric constant of the surrounding medium;

a second transmission line probe arranged and configured to guide an electromagnetic second transmit signal from said transceiver arrangement through the surrounding medium towards said product inside the tank, and to return an electromagnetic second surface echo signal resulting from reflection of said second transmit signal by the surface of said product back towards said transceiver arrangement, the second transmission line probe being configured to guide said second transmit signal with a second propagation velocity exhibiting a second dependence, different from the first dependence, on the dielectric constant of the surrounding medium; and processing circuitry connected to the transceiver arrangement for determining the filling level based on said first surface echo signal, said second surface echo signal, and a known relation between said first dependence and said second dependence on the dielectric constant of the surrounding medium.

2. The radar level gauge system according to claim 1, wherein said first transmission line probe comprises a first transmission line probe conductor and a first dielectric enclosing structure at least partly enclosing said first transmission line probe conductor.

3. The radar level gauge system according to claim 2, wherein said second transmission line probe comprises a second transmission line probe conductor and a second dielectric enclosing structure at least partly enclosing said second transmission line probe conductor.

4. The radar level gauge system according to claim 3, wherein said first dielectric enclosing structure comprised in said first transmission line probe is different from said second dielectric enclosing structure comprised in said second transmission line probe.

5. The radar level gauge system according to claim 4, wherein at least one of a dielectric constant and an enclosing thickness of said first dielectric enclosing structure is different from a dielectric constant and an enclosing thickness, respectively, of said second dielectric enclosing structure.

6. The radar level gauge system according to claim 1, wherein:

said transceiver arrangement is arranged on an outside of said tank; and said radar level gauge system further comprises a tank feed-through arrangement for electrically connecting said transceiver arrangement with said first transmission line probe and said second transmission line probe on an inside of said tank.

7. The radar level gauge system according to claim 6, wherein said feed-through arrangement comprises a first feed-through for said first transmission line probe, and a second feed-through for said second transmission line probe.

8. The radar level gauge system according to claim 7, wherein said transceiver arrangement comprises:
   a first transceiver connected to said first transmission line probe through said first feed-through; and
   a second transceiver connected to said second transmission line probe through said second feed-through.

9. The radar level gauge system according to claim 7, wherein:
   said transceiver arrangement comprises a common transceiver; and
   said radar level gauge system further comprises a signal routing arrangement connected to said first feed-through, said second feed-through, and said common transceiver for allowing said common transceiver to be connected to said first transmission line probe and said second transmission line probe in sequence.

10. The radar level gauge system according to claim 1, wherein:
    said first transmit signal exhibits a first frequency range having a first center frequency; and
    said second transmit signal exhibits a second frequency range having a second center frequency, being equal to said first center frequency.

11. The radar level gauge system according to claim 1, wherein:
    said first transmission line probe is configured to guide said first transmit signal in a first propagation mode; and
    said second transmission line probe is configured to guide said second transmit signal in said first propagation mode.

12. The radar level gauge system according to claim 1, wherein:
    said radar level gauge system comprises:
    a first level gauging unit including said first transmission line probe and a first transceiver connected to said first transmission line probe; and
    a second level gauging unit including said second transmission line probe and a second transceiver connected to said second transmission line probe; and
    said processing circuitry comprises:
    a first measurement unit connected to said first transceiver for determining a first filling level indication based on said first transmit signal;
    a second measurement unit connected to said second transceiver for determining a second filling level indication based on said second transmit signal; and
    filling level determining circuitry connected to said first measurement unit and said second measurement unit for determining said filling level based on said first filling level indication, said second filling level indication, and known signal transmission properties of said first transmission line probe and said second transmission line probe.

13. The radar level gauge system according to claim 12, wherein said radar level gauge system comprises:
    a first tank feed-through connecting said first transceiver arranged on an outside of said tank and said first transmission line probe arranged on an inside of said tank; and
    a second tank feed-through connecting said second transceiver arranged on an outside of said tank and said second transmission line probe arranged on an inside of said tank.

14. A method of determining a filling level of a product in a tank using a radar level gauge system comprising a transceiver arrangement, a first transmission line probe configured to guide a given electromagnetic signal through a surrounding medium with a first propagation velocity exhibiting a first dependence on a dielectric constant of the surrounding medium, a second transmission line probe configured to guide said given electromagnetic signal through said surrounding medium with a second propagation velocity exhibiting a second dependence, different from said first dependence, on said dielectric constant of the surrounding medium, and processing circuitry for determining the filling level, said method comprising the steps of:
    propagating, by said first transmission line probe, an electromagnetic first transmit signal originating from said transceiver towards a surface of the product in the tank;
    propagating, by said first transmission line probe, an electromagnetic first surface echo signal resulting from reflection of said first transmit signal at said surface back towards said transceiver;
    receiving, by said transceiver, said first surface echo signal;
    propagating, by said second transmission line probe, an electromagnetic second transmit signal originating from said transceiver towards a surface of the product in the tank;
    propagating, by said second transmission line probe, an electromagnetic second surface echo signal resulting from reflection of said second transmit signal at said surface back towards said transceiver;
    receiving, by said transceiver, said second surface echo signal;
    determining, by said processing circuitry, said filling level based on said first surface echo signal, said second surface echo signal, and a known relation between said first dependence and said second dependence on said dielectric constant of the surrounding medium.

15. The method according to claim 14, wherein said step of determining said filling level comprises the steps of:
    determining, by said processing circuitry, a first value indicative of a time between transmission of said first transmit signal and reception of said first surface echo signal;
    determining, by said processing circuitry, a second value indicative of a time between transmission of said second transmit signal and reception of said second surface echo signal; and
    determining said filling level based on said first value, said second value and known propagation properties of said first transmission line probe and said second transmission line probe.

* * * * *